(12) United States Patent
Hamada et al.

(10) Patent No.: US 10,062,862 B2
(45) Date of Patent: Aug. 28, 2018

(54) ORGANIC LIGHT-EMITTING DIODE (OLED) DISPLAY PANEL, ELECTRONIC DEVICE AND MANUFACTURING METHOD

(71) Applicants: Shanghai Tianma AM-OLED Co., Ltd., Shanghai (CN); Tianma Micro-Electronics Co., Ltd., Shenzhen (CN)

(72) Inventors: Yuji Hamada, Shanghai (CN); Zhihong Lei, Shanghai (CN); Jinghua Niu, Shanghai (CN); Xiangcheng Wang, Shanghai (CN); Wei He, Shanghai (CN); Chen Liu, Shanghai (CN); Qing Zhu, Shanghai (CN)

(73) Assignees: SHANGHAI TIANMA AM-OLED CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 15/459,445

(22) Filed: Mar. 15, 2017

(65) Prior Publication Data
US 2017/0186993 A1    Jun. 29, 2017

(30) Foreign Application Priority Data
Nov. 24, 2016 (CN) .......................... 2016 1 1051528

(51) Int. Cl.
| | |
|---|---|
| *H01L 51/52* | (2006.01) |
| *H01L 51/50* | (2006.01) |
| *H01L 51/56* | (2006.01) |
| *H01L 27/32* | (2006.01) |
| *H01L 51/00* | (2006.01) |

(52) U.S. Cl.
CPC ...... *H01L 51/5218* (2013.01); *H01L 27/3211* (2013.01); *H01L 27/3262* (2013.01); *H01L 51/0021* (2013.01); *H01L 51/0022* (2013.01); *H01L 51/5012* (2013.01); *H01L 51/5016* (2013.01); *H01L 51/5212* (2013.01); *H01L 51/5228* (2013.01); *H01L 51/5265* (2013.01); *H01L 51/5275* (2013.01); *H01L 51/56* (2013.01); *H01L 2227/323* (2013.01);
(Continued)

(58) Field of Classification Search
None
See application file for complete search history.

(56) References Cited

U.S. PATENT DOCUMENTS

| | | | | |
|---|---|---|---|---|
| 2006/0238120 | A1* | 10/2006 | Miller | .................... C09K 11/06 313/506 |
| 2009/0072725 | A1* | 3/2009 | Suzuki | ................ H01L 51/0031 313/504 |

(Continued)

FOREIGN PATENT DOCUMENTS

CN          101212025 A         7/2008

*Primary Examiner* — Whitney T Moore
(74) *Attorney, Agent, or Firm* — Anova Law Group, PLLC

(57) ABSTRACT

The present disclosure provides an OLED display panel, an electronic device, and a manufacturing method. The OLED display panel comprises a substrate, a first electrode, a light-emitting function layer, and a second electrode including Ag or a metal alloy containing Ag. When the second electrode is made of the metal alloy containing Ag, a content of Ag in the second electrode is more than a sum of contents of all other elements in the second electrode.

19 Claims, 6 Drawing Sheets

(52) U.S. Cl.
CPC .. *H01L 2251/301* (2013.01); *H01L 2251/308* (2013.01); *H01L 2251/5338* (2013.01)

(56) References Cited

U.S. PATENT DOCUMENTS

| | | | |
|---|---|---|---|
| 2009/0102358 A1* | 4/2009 | Shimoji | H01L 51/5234 313/504 |
| 2010/0051973 A1* | 3/2010 | Kobayashi | H01L 51/5092 257/88 |
| 2011/0031479 A1* | 2/2011 | Ryu | H01L 51/5237 257/40 |
| 2012/0138966 A1* | 6/2012 | Shin | H01L 51/5231 257/88 |
| 2013/0187132 A1* | 7/2013 | Ando | H01L 51/0004 257/40 |
| 2017/0012225 A1* | 1/2017 | Heo | H01L 51/0094 |
| 2018/0026081 A1* | 1/2018 | Lee | H01L 27/3223 |

\* cited by examiner

ORGANIC LIGHT-EMITTING DIODE (OLED) DISPLAY PANEL, ELECTRONIC DEVICE AND MANUFACTURING METHOD

CROSS-REFERENCES TO RELATED APPLICATIONS

This application claims the priority of Chinese Patent Application No. CN201611051528.7, filed on Nov. 24, 2016, the entire contents of which are incorporated herein by reference.

FIELD OF THE DISCLOSURE

The present disclosure generally relates to the display technology and, more particularly, relates to an OLED display panel, at electronic device and a manufacturing method.

BACKGROUND

Organic light-emitting diodes (OLEDs) are also known as organic electroluminescent devices. Driven by an electric field, the light-emitting material in the OLED emits light through carrier injection and recombination. Compared to liquid crystal display (LCD) devices, the OED devices are thinner and lighter, and have wider viewing angles and higher contrast. Thus, the OLED devices are becoming more and more popular.

In the existing technology, the OLED display panel often includes a first electrode, a second electrode, and a light-emitting layer formed between the first electrode and the second electrode. Generally, the second electrode is made of MgAg alloy. However, the Mg—Ag alloy exhibits different light transmittance of red, green, and blue light, causing a sacrifice of red and green light efficiency for the sake of blue light efficiency, and an increase in power consumption of the OLED display panel in addition. In addition, the Mg deposition process is costly, and the Mg deposition rate is difficult to control. The substantially high bulk resistance of Mg leads to a substantially high operating voltage. As a result, the efficiency and life span of the device may be degraded.

The disclosed OLED display panel, electronic device and manufacturing method are directed to solve one or more problems set forth above and other problems.

BRIEF SUMMARY OF THE DISCLOSURE

One aspect of the present disclosure provides an OLED display panel, comprising a substrate, a first electrode, a light-emitting function layer, and a second electrode including Ag or a metal alloy containing Ag. When the second electrode is made of the metal alloy containing Ag, a content of Ag in the second electrode is more than a sum of contents of all other elements in the second electrode.

Another aspect of the present disclosure provides an electronic device comprising an OLED display panel. The OLED display panel comprises a substrate, a first electrode, a light-emitting function layer, and a second electrode including Ag or a metal alloy containing Ag. When the second electrode is made of the metal alloy containing Ag, a content of Ag in the second electrode is more than a sum of contents of all other elements in the second electrode.

Another aspect of the present disclosure provides a manufacturing method for the disclosed OLED display panel. The manufacturing method comprises sequentially forming a first electrode, a light-emitting function layer, and a second electrode including Ag or a metal alloy containing Ag on a substrate. When the second electrode is made of the metal alloy containing Ag, a content of Ag in the second electrode, is more than a sum of contents of all other elements in the second electrode.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings.

The present disclosure provides an improved OLED display panel, which may comprise a first electrode, a light-emitting function layer, and a second electrode disposed on a substrate in a stacked configuration. The second electrode may include Ag or a metal alloy containing Ag. When the second electrode includes a metal alloy containing Ag, the content of Ag may be more than the sum of the contents of other elements in the second electrode.

In the disclosed embodiments, the second electrode of the OLED display panel may include Ag or a metal alloy containing Ag. When the second electrode includes a metal alloy containing Ag, the Ag content may be configured to be more than the sum of the contents of other elements in the second electrode. As a result, the light-emitting efficiencies of light-emitting units emitting different colors (e.g., a red light-emitting unit emitting red light, a blue light-emitting unit emitting blue light, and a green light-emitting unit emitting green light) may be balanced, the overall light-emitting efficiency of the OLED display panel may be improved, and the bulk resistance of the second electrode may be reduced. Thus, under a same current density, the operating voltage of the OLED display panel may be reduced, and the power consumption of the OLED display panel may be reduced.

Figure 1:
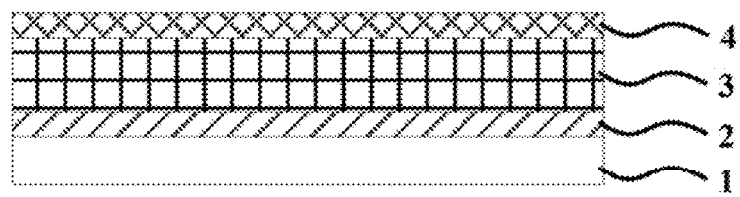
FIG. 1 illustrates a cross-sectional view of an exemplary OLED display panel according to the disclosed embodiments.

FIG. 1 illustrates a cross-sectional view of an exemplary OLED display panel according to the present disclosure. As shown in FIG. 1, the OLED display panel may include a substrate 1, a first electrode 2, a light-emitting function layer 3, and a second electrode 4. The first electrode 2, the light-emitting function layer 3, and the second electrode 4 may be formed on a substrate 1. The second electrode 4 may be made of Ag or a metal alloy containing Ag. When the second electrode 4 is made of a metal alloy containing Ag, the content of Ag in the second electrode 4 may be more than the sum of the contents of all other elements in the second electrode 4.

Figure 2:
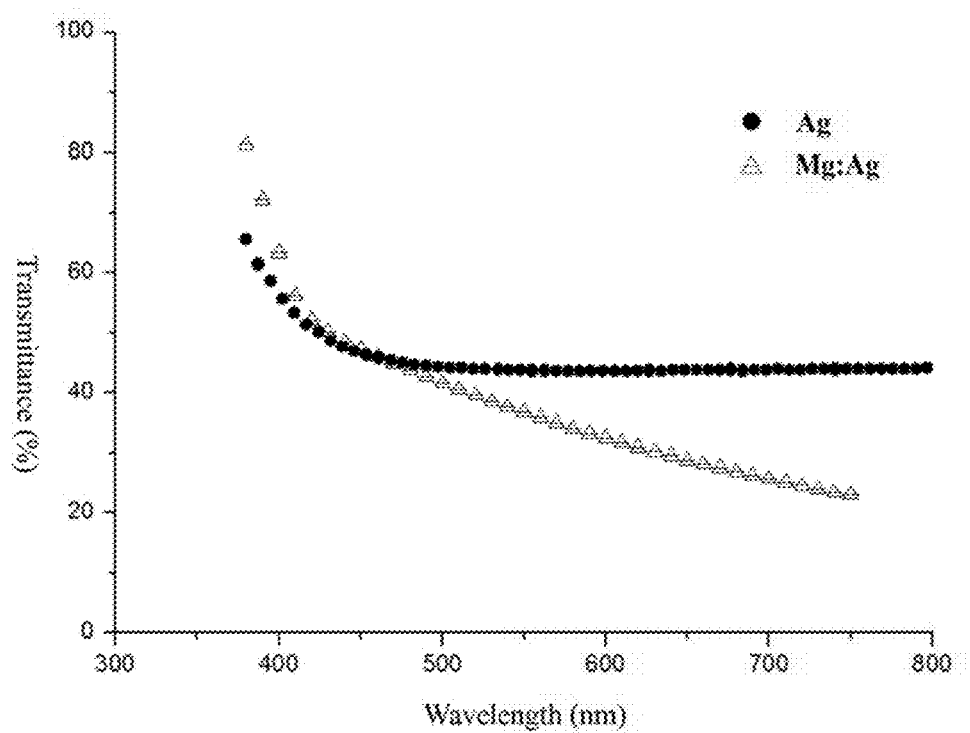
FIG. 2 illustrates a wavelength-dependent light transmittance of an existing second electrode made of a MgAg alloy and an exemplary second electrode made of pure Ag according to the disclosed embodiments.

FIG. 2 illustrates a wavelength-dependent light transmittance of an existing second electrode made of a MgAg alloy and an exemplary second electrode made of pure Ag according to the disclosed embodiments. Both second electrodes may have a same thickness (15 Å). The volume ratio of the Mg content and the Ag content in the MgAg alloy in the existing second electrode is about 10:1.

As shown in FIG. 2, for the existing second electrode made of a MgAg alloy (the ratio of Mg content and Ag content is about 10:1), the blue light transmittance at the wavelength of 460 nm is about 43%, the green light transmittance at the wavelength of 530 nm is about 37%, and the red light transmittance at the wavelength of 620 nm is about 25%. That is, the light transmittance at three different wavelengths may vary a lot.

For the disclosed second electrode made of pure Ag, the light transmittance at different wavelengths may not vary significantly. As shown in FIG. 2, the blue light transmittance at the wavelength of 460 nm is about 46%, the red light transmittance at the wavelength of 530 nm is about 44%, and the red light transmittance at the wavelength of 620 nm is about 43%. That is, the light transmittance at three different wavelengths may vary a little, i.e., substantially remain the same. As shown in FIG. 2, within the wavelength range approximately between 450 nm and 800 nm, the light transmittance different of the second electrode made of pure Ag may be less than the light transmittance difference of the second electrode made of the MgAg alloy (the ratio of Mg content and Ag content is about 10:1).

Table 1 shows bulk resistance of the existing second electrode made of a MgAg alloy (the ratio of Mg content and Ag content is about 10:1). Table 2 shows bulk resistance of the disclosed second electrode made of pure Ag. Comparing Table 1 and Table 2 the disclosed second electrode made of pure Ag may have lower bulk resistances than the existing second electrode made of the MgAg alloy. For example, as shown in Table 1, the bulk resistance of the MgAg alloy with a thickness of about 140 Å is about 6.27Ω, and as shown in Table 2, the bulk resistance of the pure Ag with a thickness of about 140 Å is about 3.74Ω.

TABLE 1

Bulk resistance of an existing second electrode made of a MgAg alloy (the ratio of Mg content and Ag content is about 10:1)

| Thickness (Å) | Bulk resistance (Ω) |
| --- | --- |
| 120 | 7.99 |
| 140 | 6.27 |
| 160 | 5.52 |
| 180 | 5.64 |
| 200 | 5.21 |

TABLE 2

Bulk resistance of an exemplary second electrode made of pure Ag

| Thickness (Å) | Bulk resistance (Ω) |
| --- | --- |
| 130 | 4.23 |
| 140 | 3.74 |
| 150 | 3.27 |

Figure 3:
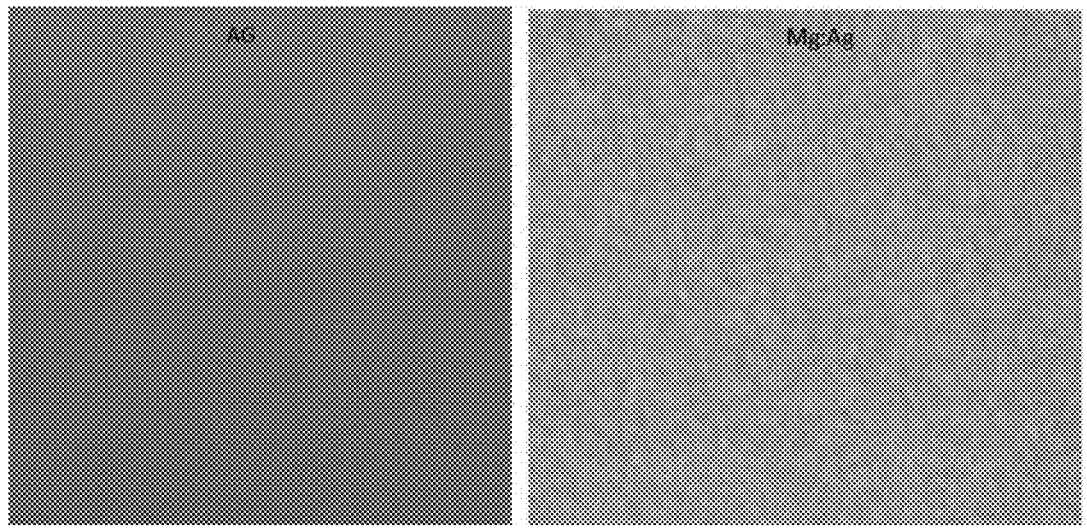
FIG. 3 illustrates scanning electron microscope (SE) images of an existing second electrode made of a MgAg alloy and an exemplary second electrode made of pure Ag according to the disclosed embodiments.

FIG. 3 illustrates scanning electron microscope (SEM) images of an existing second electrode made of a MgAg alloy and an exemplary second electrode made of pure Ag according to the disclosed embodiments. As shown in FIG. 3, under the same film-forming condition, the same film thickness, and the same test condition, the average roughness of the electrode film made of the MgAg alloy is about 6 nm, and the average roughness of the electrode film made of pure alloy is about 2 nm. That is, the second electrode made of pure Ag may have a smoother surface and a denser film than the second electrode made of the MgAg alloy.

Figure 4:
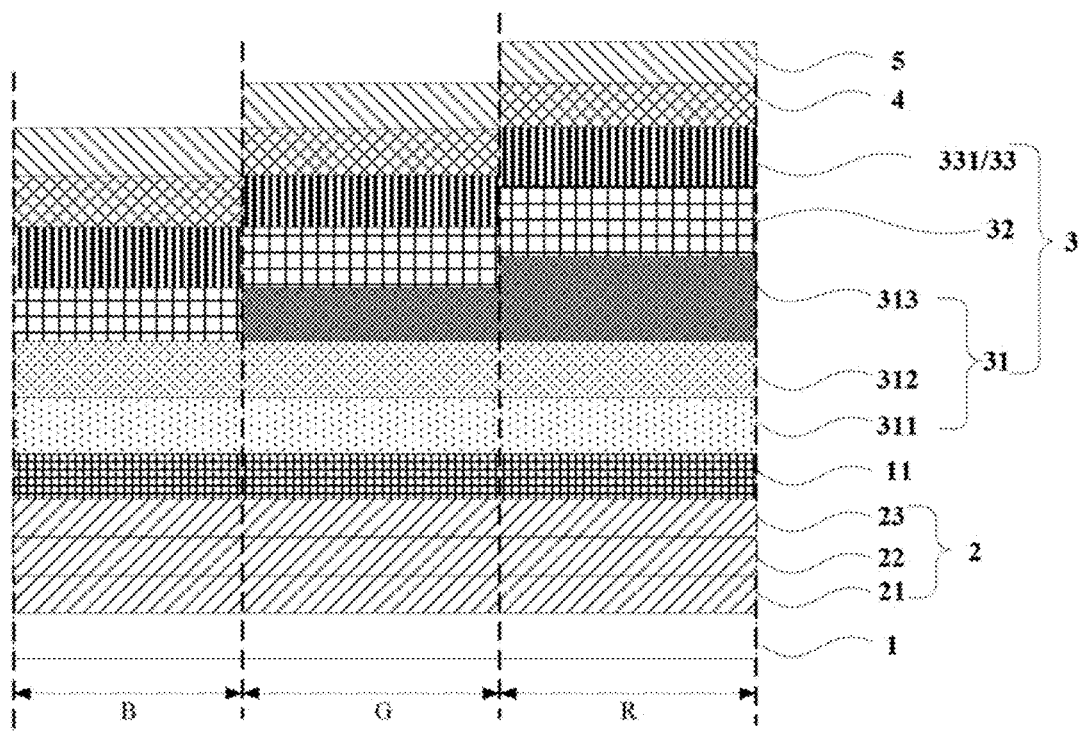
FIG. 4 illustrates a cross-sectional partial view of another exemplary OLED display panel according to the disclosed embodiments.

FIG. 4 illustrates a cross-sectional partial view of another exemplary OLED display panel according to the present disclosure. The similarities between FIG. 4 and FIG. 1 are not repeated here, while certain difference may be explained.

Referring to FIG. 4, different from FIG. 1, in the OLED display panel in FIG. 4, the first electrode 2 may include a first transparent conductive film 21, a reflective conductive film 22, and a second transparent conductive film 23. The reflective conductive film 22 may be made of Ag or other opaque metal. The reflective conductive film 22 may be configured to increase the reflectance and improve the light efficiency of the OLED display panel.

In one embodiment, the first transparent conductive film 21 and the second transparent conductive film 23 may be made of, for example, indium tin oxide (ITO), indium zinc oxide (IZO), or zinc oxide (ZnO). The first transparent conductive film 21 and the second transparent conductive film 23 in the first electrode 2 may be made of a high work function material, facilitating the hole injection.

Further, the material of the first electrode 2 and the thickness of the individual films may be adjusted to control the reflectance of the first electrode 2. In one embodiment, the reflectance of the first electrode 2 may be configured to be greater than about 80%. The first electrode 2 and the second electrode 4 may be formed by a deposition method, a sputtering method, a vapor deposition method, an ion beam deposition method, an electron beam deposition method, and a laser ablation method, etc.

In another embodiment, the reflective conductive film 22 may be configured to have a thickness h1 greater than about 500 Å, which may increase the reflectance of the first electrode 2 and improve the light-emitting efficiency of the OLED display panel.

In another embodiment, the second electrode 4 may be configured to have a thickness h2 ranging approximately between 120 Å and 250 Å, through which the light-emitting efficiency of the light-emitting units emitting light in different colors may be balanced, and the resistance of the second electrode 4 may be reduced. Accordingly, the power consumption of the OLED display panel may be reduced.

In another embodiment, when the second electrode 4 is made of a metal alloy containing Ag, the content of Ag (i.e. the Ag content) in the second electrode 4 may be more than about 80%. As the Ag content increases, the light transmittance curve may gradually approach the light transmittance curve for the pure Ag. That is, the difference in the light transmittance at different wavelength may be reduced, and the light-emitting efficiency of the OLED display panel may be improved.

In another embodiment, the second electrode 4 may be configured to have a transmittance greater than about 20%. The low resistance of the second electrode 4 may be assured and, meanwhile, the light-emitting efficiency of the OLED display panel may be improved through configuring the light transmittance of the second electrode 4 to be greater than about 20%.

In another embodiment, when the second electrode 4 is made of a metal alloy containing Ag, the metal alloy containing Ag may also include at least one of a Mg element, a Yb element, an alkali metal element, an alkaline earth metal element, and a rare earth element.

In certain embodiments, referring to FIG. 4, the OLED display panel may include a plurality of light-emitting units. In one embodiment, as shown in FIG. 4, the OLED display panel may include a light-emitting unit R emitting red light, a light-emitting unit G emitting green light, and a light-emitting unit B emitting blue light. The number and color of the light-emitting units is for illustrative purposes and is not intended to limit the scope of the present disclosure.

A micro-cavity structure may be formed between the first electrode 2 and the second electrode 4 in a light-emitting unit. The micro-cavity structures corresponding to the light-emitting units emitting light in different colors may have different effective cavity lengths. The effective cavity length may refer to an optical path length in the micro-cavity structure.

Further, as shown in FIG. 4, the light-emitting, function layer may further include a first auxiliary function layer 31, a light-emitting layer 32, and a second auxiliary function layer 33. The first auxiliary function layer 31, the light-emitting layer 32, and the second auxiliary function layer 33 may be formed by a deposition method. The first auxiliary function layer 31 may be a hole-type auxiliary function layer having a multi-layer structure. In one embodiment, as shown in FIG. 4, the first auxiliary function layer 31 may further include a hole injection layer 311, a hole transport layer 312, and an electron blocking layer (not shown). The second auxiliary function layer 33 may be an electron-type auxiliary function layer, having a multi-layer structure. In another embodiment, as shown in FIG. 4, the second auxiliary function layer 33 may include an electron transport layer 331, an electron injection layer (not shown), and a hole blocking layer (not shown). The film structure of the first auxiliary function layer 31 and the second auxiliary function layer 33 in FIG. 4 is for illustrative purposes, and is not intended to limit the scope of the present disclosure.

In the OLED display panel, an optical micro-cavity (referred to as a micro-cavity structure) may be adopted to adjust the light-emitting performance. The micro-cavity structure may be formed by a plurality of films between the two electrodes of the OLED display panel, in which the effects of reflection, total reflection, interference, refraction, or scattering at the interface of discontinuous refractive index may be used to confine the emitted light in a relatively small wavelength band.

Through designing the cavity length and the thickness of individual films in the micro-cavity structure, the wavelength center of the emitting light may be configured to be near the antinodes of the standing wave formed in the micro-cavity structure. Accordingly, the coupling efficiency of the device radiation dipole and the electric field in the micro-cavity structure may be increased, and the light-emitting efficiency and brightness of the OLED display panel may be increased.

The cavity length of the micro-cavity structure corresponding to the light-emitting unit may be positively correlated to the wavelength of the light emitted by the light-emitting unit. The effective cavity length of the micro-cavity structure may be adjusted by the first auxiliary function layer 31, the light-emitting layer 32, and the second auxiliary function layer 33.

In one embodiment, as shown in FIG. 4, the effective cavity length in the micro-cavity structure may be adjusted by the hole transport layer 312 of the first auxiliary function layer 31. The hole transport layer, which may be configured to adjust the effective cavity length in the micro-cavity structure, is also called as a hole transport auxiliary layer 313. In one embodiment, as shown in FIG. 4, the hole transport auxiliary layer 313 may be disposed on the hole transport layer 312 in the red light-emitting unit R emitting red light and the green light-emitting unit G emitting green light, and the hole transport auxiliary layer 313 corresponding to the light-emitting unit R emitting red light may be thicker than the hole transport auxiliary layer 313 corresponding to the light-emitting unit G emitting green light, which is for illustrative purposes and is not intended to limit the scope of the present disclosure.

In certain embodiments, referring to FIG. 4, a light coupling organic layer 5 may be disposed on the side of the second electrode 4 facing away from the substrate to increase the light-emitting efficiency of the OLED display panel. The light coupling organic layer 5 may have a refractive index greater than the second electrode 4. In one embodiment, the total transmittance of the second electrode 4 and the light coupling organic layer 5 may be configured to be greater than about 60%. The refractive indexes of the light coupling organic layer 5 and the second electrode 4 may be coordinated to enhance the brightness enhancement effect of the micro-cavity structure, and to improve the luminous efficiency of the OLED display panel.

In addition, a buffer layer 11 may be disposed between the first electrode 2 and the hole injection layer 311 to increase the hole injection efficiency. The buffer layer 11 may be made of a mixture of a P-type dopant material and a hole injection (HI) material. In one embodiment, the volume percentage ratio of the P-type dopant material over the HI material may be approximately between 1% and 8%.

In certain embodiments, the light-emitting layer 32 may include a host material and a guest dopant material. At least one of the light-emitting layer 32 corresponding to the red light-emitting unit R emitting red light and the light-emitting layer 32 corresponding to the blue light-emitting unit B emitting blue light may be made of one or two host materials. The light-emitting layer 32 corresponding to the green light-emitting unit G emitting green light, may be made of at least two host materials.

In the light-emitting layer 32, the content of the host material may be greater than the content of the guest dopant material. The absolute value of a HOMO energy level $|T_{host}(HOMO)|$ of the host material may be greater than the absolute value of a HOMO energy level $|T_{dopant}(HOMO)|$ of the guest dopant material, the absolute value of a LUMO energy level $|T_{host}(LUMO)|$ of the host material may be smaller than the absolute value of a LUMO energy level $|T_{dopant}(LUMO)|$ of the guest dopant material, and a triplet state energy level $T_{host}(S)$ of the host material may be greater than a triplet state energy level $T_{dopant}(S)$ of the guest dopant material. The triplet state energy of the host material may be effectively transferred to the guest dopant material, and the light emission spectrum of the host material may match the light absorption spectrum of the guest dopant material.

In addition, the guest dopant material of the light-emitting layer 32 may include a phosphorescent or fluorescent material. For example, the guest dopant material of the light-emitting layer 32 corresponding to the red light-emitting unit R and the green light-emitting unit G may be a phosphorescent material, and the guest dopant material of the light-emitting layer 32 corresponding to the blue light-emitting unit B may be a fluorescent material. The material of the light-emitting layer 32 is not limited by the present disclosure. In certain embodiments, the light-emitting layer 32 may be made of a material other than the host-guest dopant structure or made of a thermally activated delayed fluorescent (TADF) material.

In addition, the power consumption of the OLED devices having the second electrode 4 made of a MgAg alloy and the second electrode made of pure Ag is tested, respectively. For ease of comparison, both OLED devices may have a structure as shown in FIG. 4.

In particular, the buffer layer 11 may be made of PEDOT:PSS, having a thickness of about 100 Å. The reflective conductive film 22 of the first electrode 2 may be made of Ag, having a thickness of about 600 Å. The first transparent conductive film 21 and the second transparent conductive film 23 may be made of indium tin oxide (ITO), having a thickness of about 200 Å. The hole, injection layer 311 may be made of 4,4',4''-[3-methylphenyl(phenyl)-amino]triphenylamine (m-MTDATA), having a thickness of about 800 Å. The hole transport layer 312 may be made of N,N'-diphenyl-N,N'-bis(3-methylphenyl)-1,1'-biphenyl-4,4'-diamine (TPD), having a thickness of about 300 Å.

The hole transport auxiliary layer 313 may be made of a same material as the hole transport layer 312. The hole transport auxiliary layer 313 corresponding to the green light-emitting unit G may have a thickness of about 300 Å. The hole transport auxiliary layer 313 corresponding to the red light-emitting unit R may have a thickness of about 900 Å.

The light-emitting, layer 32 may be formed by doping a guest dopant material into a host material, and may have a thickness of about 300 Å. The doping ratio of the guest material and the host material in the light-emitting layer 32 may be approximately between 1% and 10% by volume. In one embodiment, as shown in FIG. 4, the host material of the light-emitting unit R to emit red light may be 4,4'-bis(9-carbazole)biphenyl (CBP), and the guest dopant material may be PQIr. The host material of the light-emitting unit G to emit green light may be 4,4'-bis(9-carbazole)biphenyl (CBP) and N,N'-dicarbazolyl-3,5-benzene (mCP), and the guest dopant material may be tris(2-phenylpyridine)iridium (Ir(PPY)$_3$). The host material of the light-emitting unit B to emit blue light may be 4,4'-bis(9-carbazole)biphenyl (CBP), and the guest dopant material may be FIrpic.

The electron transport layer 331 may be made of 8-hydroxyquinoline aluminum (Alq3), having a thickness of about 300 Å. The second electrode 4 may have a thickness of about 200 Å. The light coupling organic layer 5 may be made of LiF, having a thickness of about 500 Å. Given the OLED display panel structure as shown in FIG. 4, the test result indicates that the power consumption may be about 1.13 W when the second electrode 4 is made of pure Ag, and the power consumption may be about 1.38 W when the second electrode 4 is made of a MgAg alloy (10:1). Thus, the second electrode 4 made of pure Ag may reduce the device power consumption.

Figure 5:
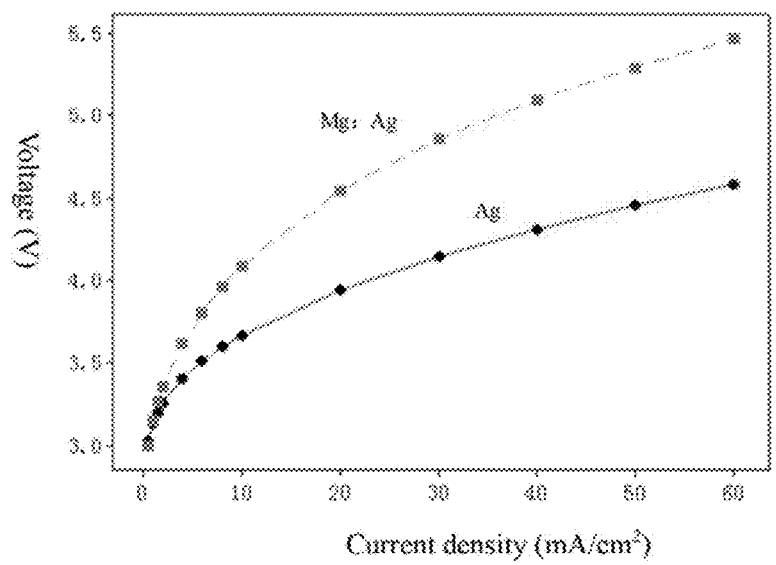
FIG. 5 illustrates volt-ampere (V-A) curves of all existing OLED device and an exemplary OLED display panel according to the disclosed embodiments.

Further, the voltage-current density and current efficiency-current density is also measured for the OLED display panel shown in FIG. 4, in which n the first electrode 2 adopts an ITO/Ag/ITO structure has a reflectance greater than about 80%, and the second electrode 4 is made of pure Ag. The measuring, results show that the performance of the OLED display panel may improve substantially. FIG. 5 illustrates volt-ampere (V-A) curves of an existing OLED device and an exemplary OLED display panel according to the present disclosure.

Referring to FIG. 5, the second electrode of the existing OLED display panel is made of a MgAg alloy (the ratio of the Mg content and the Ag content is about 10:1). The first electrode of the OLED display panel according to the present disclosure may be a reflective electrode having a high reflectance, and the second electrode may be made of pure Ag. Given the same current density, the operating voltage of the OLED display panel according to the present disclosure may be significantly reduced. Thus, the power consumption of the OLED display panel may be reduced.

Figure 6:
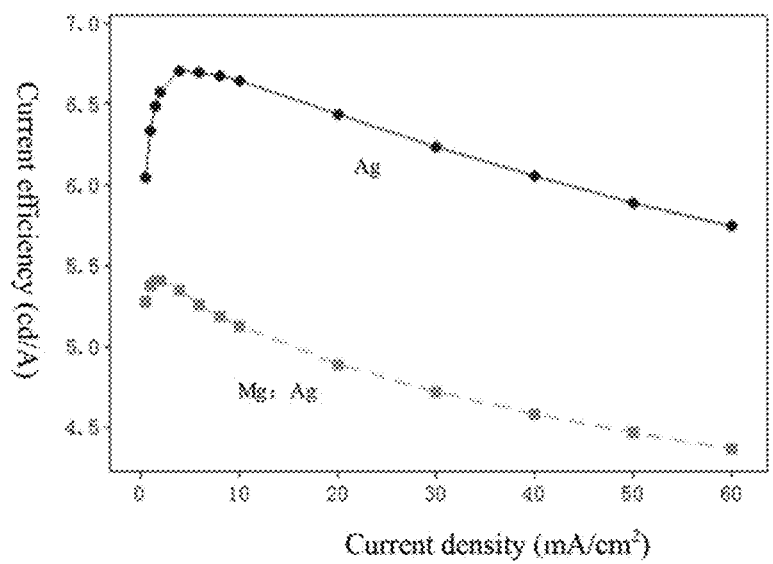
FIG. 6 illustrates current efficiency vs current density curves of an existing OLED device and an exemplary OLED display panel according to the disclosed embodiments.

FIG. 6 illustrates current efficiency vs current density curves of an existing OLED device and an exemplary OLED display panel according to the present disclosure. The OLED display panels under testing may have a structure as shown in FIG. 4. Referring to FIG. 6, the second electrode of the existing OLED display panel is made of a MgAg alloy (the ratio of the Mg content and the Ag content is about 10:1). The second electrode 4 of the OLED display panel according to the present disclosure may be made of pure Ag. Given the same current density, the OLED display panel according to the present disclosure may have a substantially higher current efficiency. In FIG. 5 and FIG. 6, the test samples may have the structure as shown in FIG. 4, and the films and layers may have the same thicknesses and may be made of the same materials as the test samples in the power consumption test.

Figure 7:
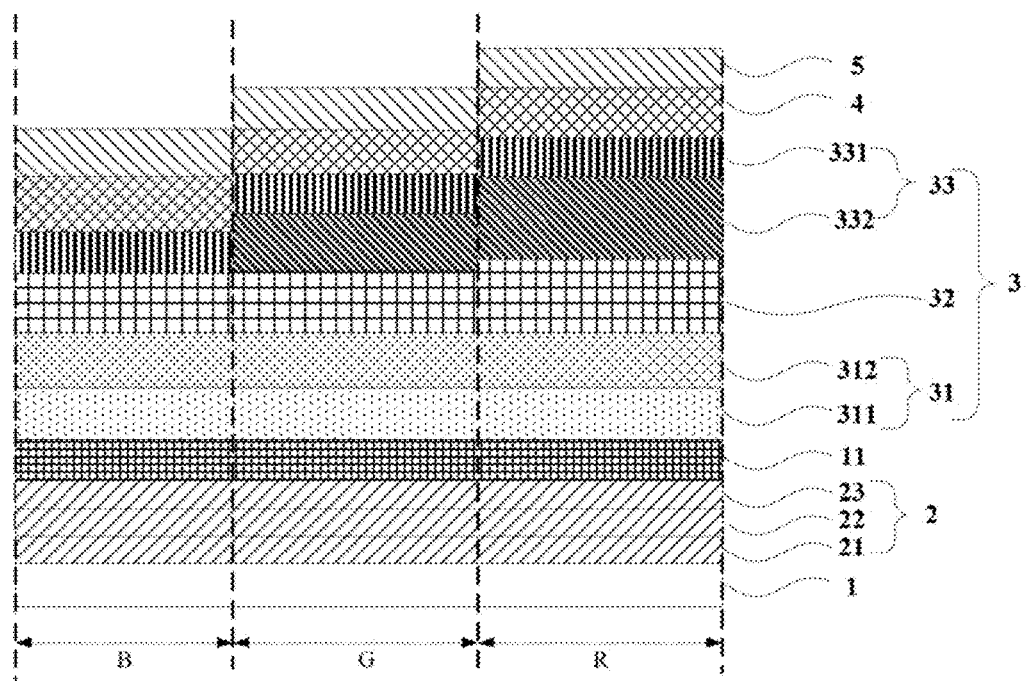
FIG. 7 illustrates a cross-sectional partial view of another exemplary OLED display panel according to the disclosed embodiments.

FIG. 7 illustrates a cross-sectional partial view of another exemplary OLED display panel according to the present disclosure. The similarity between FIG. 7 and FIG. 4 are not repeated here, while certain difference may be explained.

As shown in FIG. 7, different from the OLED display panel in FIG. 4, in the OLED display panel shown in FIG. 7, the effective cavity length may be adjusted by an electron transport layer of the second auxiliary function layer 33, and the electron transport layer for adjusting the effective cavity length of the micro-cavity structure is also called an electrode transport auxiliary layer 332.

As shown in FIG. 7, the electron transport auxiliary layer 332 may be disposed on the electron transport layer 331 corresponding to the red light-emitting unit R emitting red light, and the green light-emitting unit G emitting green light, respectively, and the electron transport auxiliary layer 332 corresponding to the red light-emitting unit R emitting red light may be thicker than the electron transport auxiliary layer 332 corresponding to the green light-emitting unit G emitting green light, which is for illustrative purposes and is not intended to limit the scope of the present disclosure.

The OLED display panel may be an active OLED display panel or a passive OLED display panel. The active OLED display panel may include a plurality of light-emitting units, such as light-emitting units R to emit red light, light-emitting units G to emit green light, and light-emitting units B to emit blue light. The first electrodes 2 corresponding to each light-emitting unit may be electrically insulated from each other. Each light-emitting unit may correspond to a thin-film transistor (TFT). The TFT may be electrically connected to the corresponding first electrode 2. Each TFT may provide a driving signal to the corresponding light-emitting unit through the corresponding first electrode 2.

The passive OLED display panel may include a plurality of light-emitting units. The light-emitting units in the same row may share the same first electrode 2. The light-emitting units in the same column may share, the same second electrode 4. The first electrodes 2 and the second electrodes 4 may intersect, and may be insulated from each other.

In the disclosed embodiments, the second electrode of the OLED display panel may be made of Ag or a metal alloy containing Ag. The content ratio of the metal alloy may be configured such that the content of Ag may be more than the sum of the contents of other elements. The bulk resistance and the light transmittance of the OLED display panel may be balanced in a desired manner, and the luminous efficiency for the light-emitting units to emit light in different colors (e.g., red light-emitting units, green light-emitting units, and blue light-emitting units) may be balanced. The overall light-emitting efficiency of the OLED display panel may be improved and, meanwhile the bulk resistance of the second electrodes may be reduced. Thus, under the same current density, the operating voltage of the OLED display panel may be reduced, and the power consumption of the OLED display panel may be reduced.

Figure 8:
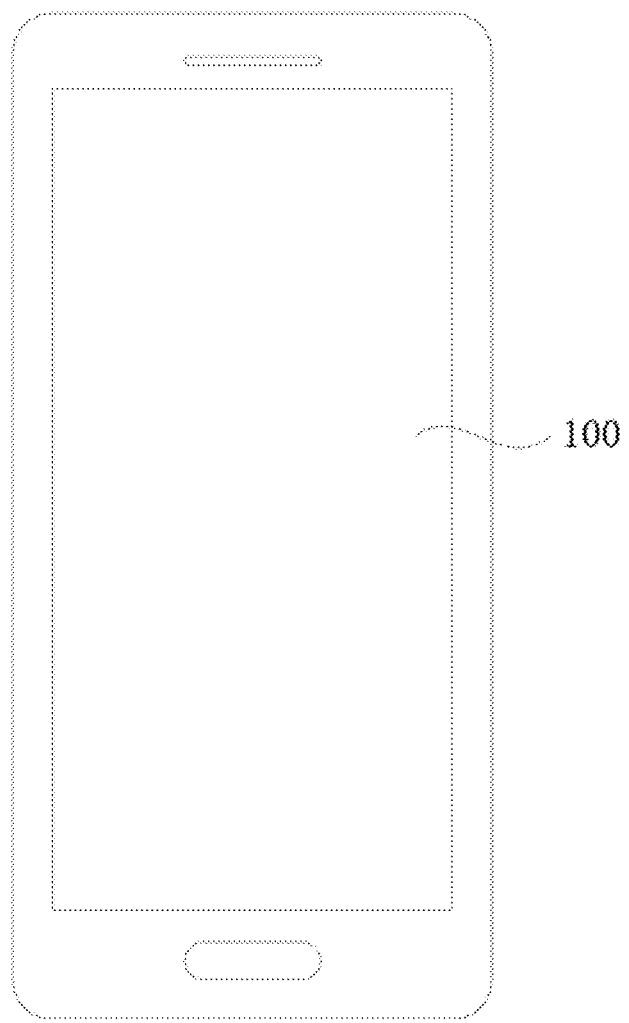
FIG. 8 illustrates a schematic view of an exemplary electronic device according to the disclosed embodiments.

The present disclosure also provides an electronic device. FIG. 8 illustrates a schematic view of an exemplary electronic device according to the present disclosure. As shown in FIG. 8, the electronic device may include any one of the disclosed OLED display panels 100. The electronic device may be a smart phone as shown in FIG. 8, a computer, a television set, and a smart wearable device, etc., which is not limited by the present disclosure.

The present disclosure also provides a manufacturing method for the OLED display panel, comprising sequentially forming a first electrode, a light-emitting function layer, and a second electrode on a substrate. The second electrode may be made of Ag or a metal alloy containing Ag. When the second electrode is made off metal alloy, the content of Ag may be more than the sum of the contents of other elements.

In the disclosed OLED display panel, the second electrode may be made of Ag or a metal alloy containing Ag, and the content ratio of the metal alloy may be configured, such that the content of Ag may be more than the sum of the contents of other elements. The desired optical characteristics of the metal Ag may be able to balance the light-emitting efficiency of the light-emitting units to emit light in different colors (e.g., red light-emitting unit, green light-emitting unit, and blue light-emitting unit). Given the same current density, the operating voltage may be reduced, and the power consumption of the disclosed OLED display panel may be reduced.

In certain embodiments, the second electrode may be formed by depositing the metal Ag. In certain other embodiments, the second electrode may be formed by depositing the metal Ag and other metals. In certain other embodiments, the second electrode may be formed by ink-jet printing. By selecting a suitable fabrication process, it is possible to reduce the cost and increase the light transmittance of the second electrode, such that the light-emitting efficiency of the OLED display panel may be improved.

Figure 9:
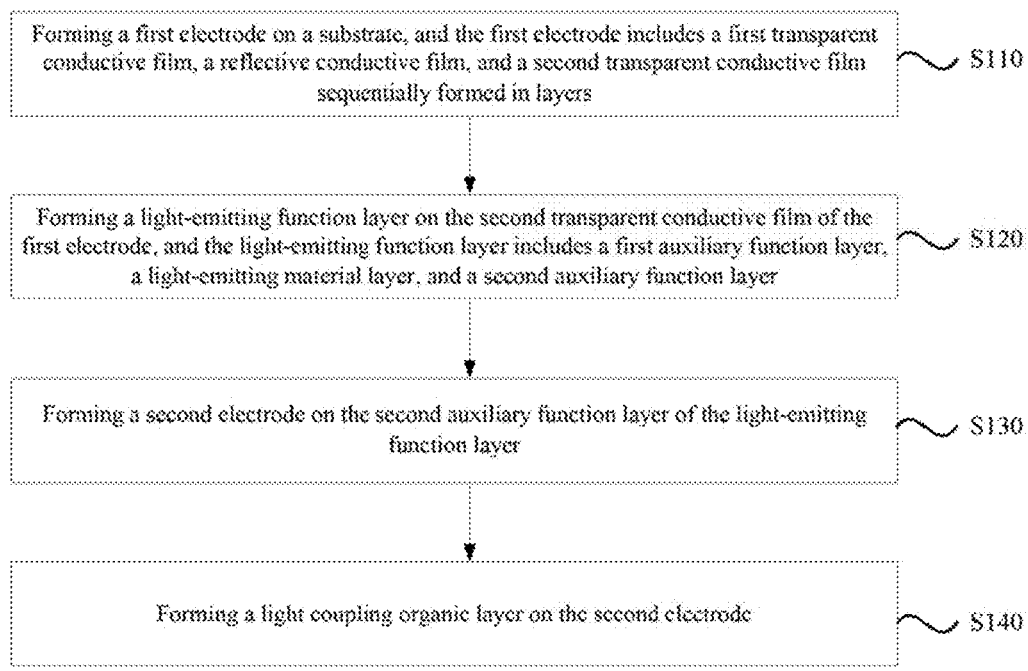
FIG. 9 illustrates a flow chart of an exemplary manufacturing method for an exemplary OLED display panel according to the disclosed embodiments.

The present disclosure also provides a manufacturing method for the OLED display panel as shown in FIG. 4. FIG. 9 illustrates a flow chart of an exemplary manufacturing method for the OLED display panel, according to the present disclosure. As shown in FIG. 9, at the beginning, a first electrode 2 is formed on a substrate 1, and the first electrode 2 includes a first transparent conductive film 21, a reflective conductive film 22, and a second transparent conductive film 23, which are sequentially formed in layers (S110). The corresponding structure is shown in FIG. 4.

The first transparent conductive film 21 and the second transparent conductive film 23 of the first electrode 2 may be made of a high work function material, facilitating hole injection. The reflective conductive film 22 may be configured to increase the light reflectance and light utilization efficiency of the OLED display panel. In one embodiment, the first transparent conductive film 21 and the second transparent conductive film 23 may be made of ITO. In another embodiment, the reflective conductive film 22 may be made of Ag, having a thickness h1 greater than about 500 Å. In another embodiment, the first electrode 2 may have a reflectance greater than about 80%.

In certain embodiments, after the first electrode 2 is formed, a pixel defining layer (not shown in FIG. 4) may be formed. The pixel defining layer may include a plurality of opening structures. Each opening structure may correspond to a light-emitting unit.

In certain other embodiments, before the first electrode 2 is formed, a pixel defining layer may be formed. The pixel defining layer may include a plurality of opening structures. A second electrode 2 may be formed in each opening structure. The pixel defining layer may prevent color mixing in the subsequently formed light-emitting layer 32.

Returning to FIG. 9, after the first electrode 2 is formed, a light-emitting function layer 3 is formed on the second transparent conductive film 23 of the first electrode, and the light-emitting function layer 3 includes a first auxiliary function layer 31, a light-emitting layer 32, and a second auxiliary function layer 33 (S120).

For the light-emitting units to emit light in different colors, the light-emitting layer 32 may be sequentially deposited by using masks. Referring to FIG. 4, the OLED display panel may include a plurality of light-emitting units. For illustration purpose, three light-emitting units to emit light in three different colors may be shown in FIG. 4, including a red light-emitting unit R to emit red light a green light-emitting unit G to emit green light, and a blue light-emitting unit 13 to emit blue light.

In certain embodiments, the thicknesses of the light-emitting layers 32 corresponding to the light-emitting units to emit light in different colors may be the same or different. Specifically, the thickness of the light-emitting layer 32 may be determined according to various factors, such as the actual manufacturing requirements, the micro-cavity structures corresponding to the light-emitting units to emit light in different colors, light-emitting layer characteristics, and the transport balances between holes and electrons in different light-emitting units, etc. The first auxiliary function layer 31 and the second auxiliary function layer 33 may be configured to achieve the balance of electron and hole injection, and to ensure that the electrons and holes are recombined in the light-emitting layer 32.

Returning to FIG. 9, after a light-emitting function layer 3 is formed on the second transparent conductive film 23 of the first electrode, a second electrode 4 is formed on the second auxiliary function layer 33 of the light-emitting function layer 3 (S130).

The second electrode 4 may be made of Ag or a metal alloy containing Ag. When the second electrode 4 is made of a metal alloy containing Ag, the content of Ag may be more than the sum of the contents of other elements. In one embodiment, when the second electrode 4 is made of a metal alloy, the content of Ag may be more than about 80%. When the second electrode 4 is made of a metal alloy containing Ag, the metal alloy containing Ag may also include at least one of Mg element, Yb element, an alkali metal element, an alkaline earth metal element, or a rare earth element. The second electrode 4 may have a thickness ranging approximately between 120 Å and 250 Å. The second electrode 4 may have a light transmittance greater than about 20%.

Returning to FIG. 9, after a second electrode 4 is formed, a light coupling organic layer 5 is formed on the second electrode 4 (S140).

The light coupling organic layer 5 may have a refractive index greater than the second electrode 4. The total light transmittance of the light coupling organic layer 5 and the second electrode 4 may be greater than about 60%.

In certain embodiments, the OLED display panel may be an active OLED display panel or a passive OLED display panel. The active OLED display panel may include a plurality of light-emitting units, such as red light-emitting units emitting red light, green light-emitting units G emitting green light, and blue light-emitting units B emitting blue light. The first electrodes 2 corresponding to each light-emitting unit may be electrically insulated from each other. Each light-emitting unit may correspond to a thin-film transistor (TFT). The TFT may be electrically connected to the corresponding first electrode 2. Each TFT may provide a driving signal to the corresponding light-emitting unit through the corresponding first electrode 2. The passive OLED display panel may include a plurality of light-emitting units. The light-emitting units in the same row may share the same first electrode 2. The light-emitting units in the same column may share the same second electrode 4. The first electrodes 2 and the second electrode 4 may intersect, and may be electrically insulated from each other.

In certain embodiments, a micro-cavity structure may be formed between the first electrode 2 and the second electrode 4 in a light-emitting unit. The micro-cavity structures corresponding to light-emitting units emitting light in different colors may have different effective cavity lengths. The effective cavity length may refer to an optical path length in the micro-cavity structure. The cavity length of the micro-cavity structure corresponding to the light-emitting unit may be positively correlated to the wavelength of light emitted from the corresponding light-emitting unit.

Referring to FIG. 4, because light in different colors have different wavelengths, the micro-cavity structures corresponding to the light-emitting units emitting light in different colors may have different effective cavity lengths. The effective cavity length of the micro-cavity structure corresponding to the green light-emitting unit G emitting green light may be shorter than the effective cavity length of the micro-cavity structure corresponding to the red light-emitting unit R emitting red light, but longer than the effective cavity length of the micro-cavity structure corresponding to the blue light-emitting unit B emitting blue light.

In certain embodiments, the OLED display panel may include a plurality of light-emitting units. The light-emitting layer 32 corresponding to the red light-emitting unit R emitting red light and the tight-emitting layer 32 corresponding to the green light-emitting unit G emitting green light may be made of a phosphorescent material, and the light-emitting layer 32 corresponding to the blue light-emitting unit B emitting blue light may be made of a fluorescent material. The light-emitting layer 32 corresponding to the red light-emitting unit R emitting red light and the light-emitting layer 32 corresponding to the blue light-emitting unit B emitting blue light may be made of one or two host materials, and the light-emitting layer 32 corresponding to the green light-emitting unit G emitting green light may be made of at least two host materials.

In the OLED display panel and the manufacturing method according disclosed by the present disclosure, the second electrode of the OLED display panel may be made of Ag or a metal alloy containing Ag, and the content ratio of the metal alloy may be configured such that the content of Ag may be more than the sum of the contents of other elements. In certain embodiments, the bulk resistance and the light transmittance may be balanced in a desired manner, and the light-emitting efficiency for the light-emitting units emitting light in different colors (e.g., red light-emitting unit, green light-emitting unit, and blue light-emitting unit) may be balanced. The overall light-emitting efficiency of the OLED display panel may be improved. The bulk resistance of the second electrodes may be reduced. Thus, given the same current density, the operating voltage of the OLED display panel may be reduced, and the power consumption of the OLED display panel may be reduced.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus while the present invention has been described in detail with reference to the above described embodiments, the present invention is not limited to the above described embodiments, but may be embodied in other equivalent forms without departing from the scope of the present invention, which is determined by the appended claims.

What is claimed is:

1. An OLED display panel, comprising:
a substrate;
a first electrode;
a light-emitting function layer;
a second electrode including Ag or a metal alloy containing Ag; and
a light coupling organic layer disposed on a side of the second electrode facing away from the substrate,
wherein when the second electrode is made of the metal alloy containing Ag, a content of Ag in the second electrode is more than a sum of contents of all other elements in the second electrode,
the first electrode has light reflectance greater than 80%,
the light coupling organic layer has a refractive index greater than the second electrode, and total transmittance of the second electrode and the light coupling organic layer is greater than about 60%.

2. The OLED display panel according to claim 1, wherein the first electrode includes:
a first transparent conductive film, a reflective conductive film, and a second conductive film sequentially disposed.

3. The OLED display panel according to claim 2, wherein:
at least one of the first transparent conductive film and the second conductive film is made of indium tin oxide (ITO); and
the reflective conductive film is made of Ag to increase light reflectance of the first electrode.

4. The OLED display panel according to claim 2, wherein:
the reflective conductive film has a thickness greater than about 500 Å.

5. The OLED display panel according to claim 1, wherein:
the second electrode has a thickness ranging approximately between 120 Å and 250 Å.

6. The OLED display panel according to claim 5, wherein:
the second electrode has a thickness ranging approximately between 200 Å and 250 Å.

7. The OLED display panel according to claim 1, wherein:
the second electrode is made of the metal alloy containing Ag; and
the content of Ag in the second electrode is greater than about 80%.

8. The OLED display panel according to claim 1, wherein:
the second electrode has light transmittance greater than about 20%.

9. The OLED display panel according to claim 1, wherein:
when the second electrode is made of the metal alloy containing Ag, the metal alloy containing Ag also includes at least one of a Mg element, a Yb element, an alkali metal element, an alkaline metal element, and a rare earth element.

10. The OLED display panel according to claim 1, further including:
a plurality of light-emitting units,
wherein the first electrodes corresponding to a light-emitting unit are electrically insulated from each other;
each light-emitting unit corresponds to a thin-film transistor; and
the thin-film transistor and the corresponding first electrode are electrically connected.

11. The OLED display panel according to claim 1, further including:
a plurality of light-emitting units,
wherein the light-emitting units in a same row share a same first electrode,
the light-emitting units in a same column share a same second electrode, and
the first electrodes and the second electrodes intersect with each other and are electrically insulated from each other.

12. The OLED display panel according to claim 1, further including:
a plurality of light-emitting units,
wherein a micro-cavity structure is formed between the first electrode and the second electrode in a light-emitting unit,
micro-cavity structures corresponding to the light-emitting units emitting light in different colors have different effective cavity lengths, and
the effective cavity length of the micro-cavity structure refers to an optical path length in the micro-cavity structure.

13. The OLED display panel according to claim 1, wherein the light-emitting function layer further includes:
a first auxiliary function layer, a light-emitting layer, and a second auxiliary function layer.

14. The OLED display panel according to claim 13, further including:
a plurality of light-emitting units,
wherein the light-emitting layer corresponding to a red light-emitting unit emitting red light and the light-emitting layer corresponding to a green light-emitting unit emitting green light are made of a phosphorescent material, and
the light-emitting layer corresponding to a blue light-emitting unit emitting blue light is made of a fluorescent material.

15. The OLED display panel according to claim 14, further including:
a plurality of light-emitting units,
wherein at least one of the light-emitting layer corresponding to a red light-emitting unit emitting red light and the light-emitting layer corresponding to a blue light-emitting unit emitting blue light is made of one or two host materials, and
the light-emitting layer corresponding to a green light-emitting unit emitting green light is made of at least two host materials.

16. An electronic device, comprising an OLED display panel, wherein the OLED display panel comprises:
a substrate;
a first electrode;
a light-emitting function layer;
a second electrode including Ag or a metal alloy containing Ag; and
a light coupling organic layer disposed on a side of the second electrode facing away from the substrate,
wherein when the second electrode is made of the metal alloy containing Ag, a content of Ag in the second electrode is more than a sum of contents of all other elements in the second electrode,
the first electrode has light reflectance greater than 80%,
the light coupling organic layer has a refractive index greater than the second electrode, and
total transmittance of the second electrode and the light coupling organic layer is greater than about 60%.

17. A manufacturing method for an OLED display panel, comprising:
sequentially forming a first electrode, a light-emitting function layer, a second electrode including Ag or a metal alloy containing Ag on a substrate, and a light coupling organic layer disposed on a side of the second electrode facing away from the substrate,
wherein when the second electrode is made of the metal alloy containing Ag, a content of Ag in the second electrode is more than a sum of contents of all other elements in the second electrode,
the first electrode has light reflectance greater than 80%,
the light coupling organic layer has a refractive index greater than the second electrode, and
total transmittance of the second electrode and the light coupling organic layer is greater than about 60%.

18. The manufacturing method for the OLED display panel according to claim 17, wherein:
the second electrode is formed by a vapor deposition of Ag; or
the second electrode is formed by a vapor deposition of a mixture of Ag and other metals.

19. The manufacturing method for the OLED display panel according to claim 17, wherein:

the second electrode is formed by ink-jet printing.

\* \* \* \* \*